United States Patent
Kimura et al.

(10) Patent No.: US 7,101,729 B2
(45) Date of Patent: Sep. 5, 2006

(54) METHOD OF MANUFACTURING A SEMICONDUCTOR DEVICE HAVING ADJOINING SUBSTRATES

(75) Inventors: Mutsumi Kimura, Kyotanabe (JP); Satoshi Inoue, Chino (JP); Sumio Utsunomiya, Suwa (JP); Hiroyuki Hara, Chino (JP); Wakao Miyazawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 165 days.

(21) Appl. No.: 10/392,191

(22) Filed: Mar. 20, 2003

(65) Prior Publication Data

US 2004/0080032 A1 Apr. 29, 2004

(30) Foreign Application Priority Data

Mar. 28, 2002 (JP) .................................... 2002-093321
Mar. 20, 2003 (JP) .................................... 2003-076904

(51) Int. Cl.
*H01L 21/44* (2006.01)

(52) U.S. Cl. .................... 438/107; 438/149; 438/464
(58) Field of Classification Search ............. 438/364, 438/365, 378, 458, 464, 479, 482, 468–488, 438/669, 670, 780, 795, 6, 106, 107, 110, 438/116, 118, 149, 151, 153, 154, 160, 164, 438/166, 311
See application file for complete search history.

(56) References Cited

U.S. PATENT DOCUMENTS

| 4,548,470 | A | * | 10/1985 | Erland | .................... 359/459 |
| 5,834,327 | A | * | 11/1998 | Yamazaki et al. | ............. 438/30 |
| 5,989,944 | A | * | 11/1999 | Yoon | ........................... 438/149 |
| 6,204,079 | B1 | * | 3/2001 | Aspar et al. | ................... 438/25 |
| 6,259,497 | B1 | | 7/2001 | McDonnell et al. | |
| 6,613,610 | B1 | * | 9/2003 | Iwafuchi et al. | ............ 438/128 |
| 6,627,518 | B1 | | 9/2003 | Inoue et al. | |
| 6,801,275 | B1 | * | 10/2004 | Lim | ........................... 349/110 |
| 2003/0119258 | A1 | * | 6/2003 | Pascucci | ..................... 438/257 |

FOREIGN PATENT DOCUMENTS

| CN | 1120178 A | 4/1996 |
| CN | 1256791 A | 6/2000 |
| JP | A-08-122769 | 5/1996 |
| JP | A-10-125931 | 5/1998 |
| JP | A 11-272209 | 10/1999 |

* cited by examiner

*Primary Examiner*—Michael Lebentritt
*Assistant Examiner*—Stanetta Isaac
(74) *Attorney, Agent, or Firm*—Oliff & Berridge, PLC

(57) ABSTRACT

The present invention aims to manufacture a large size semiconductor device with the inter-substrate transcription technology of thin film circuits. Enlargement is enabled by disposing a plurality of second substrates (21) in a tile shape. As the second substrate (21), a print substrate or flexible print circuit having double-sided wiring or multilayer wiring is employed. The plurality of second substrates (21) is driven independently, and the plurality of second substrates (21) is made to mutually overlap, and a drive circuit (23) is disposed at such overlapping portion. Moreover, the plurality of second substrates (21) is made to mutually overlap, and the mutual circuits are connected at such overlapping portion.

8 Claims, 20 Drawing Sheets

METHOD OF MANUFACTURING A SEMICONDUCTOR DEVICE HAVING ADJOINING SUBSTRATES

BACKGROUND OF THE INVENTION

1. Field of the Invention

The present invention pertains to a semiconductor device and electro-optic device employing stripping-transcription technology for stripping the thin film chip formed on a substrate and, by transcribing this to another substrate, assembling a semiconductor device. The present invention also relates to the manufacturing method of such semiconductor device and electro-optic device.

2. Description of the Related Art

A semiconductor device, for example, an electro-optic device such as a liquid crystal display device or organic EL display device, comprises function elements for carrying out a certain function of the likes of a thin film transistor or organic electroluminescence (EL) element, and a display panel including the wiring and support substrate between such function elements. Here, an electro-optic device shall mean general devices comprising an electric-optic element that emit light by an electrical effect, or which changes the state of light entering from outside, and includes those that emit light on its own, as well as those that control the passing of light. For instance, as the electro-optic element, considered may be a liquid crystal element, an electrophoretic element having a dispersive medium in which electrophoretic particles are dispersed, an EL (electroluminescence) element, and an electron emission element which makes the electron generated with the application of an electric field emit light by making such electron contact the luminescent substrate, and a display device and the like comprising the above are referred to as an electro-optic device.

Generally, the areal ratio covered by a function element in a display panel of an electro-optic device is a part of the overall area, and the wiring, electrode, support substrate and the like cover most of the area. Nevertheless, a sophisticated and complex manufacturing process is required for creating a function element of a desired performance. When manufacturing the likes of a display panel, since the support substrate, function element, wiring and so on are formed in a series of processes, a complex manufacturing process is inevitable, and, generally speaking, the manufacturing cost tends to be costly.

If it is possible to individually create the function element and wiring or support substrate and dispose such function element only at the portion required on the wiring or support substrate, on the average as a whole, the manufacturing cost of this display panel (large area semiconductor device) can be reduced. From the perspective of a manufacturing system, reduction in the manufacturing cost of semiconductor devices and electro-optic devices can be expected.

Moreover, by sequentially transcribing and disposing the function elements on a large size substrate, it will be possible to manufacture an extremely large size semiconductor device such as a large screen electro-optic device.

SUMMARY OF THE INVENTION

Nevertheless, when employing a large size substrate as the subject to be transcribed, it is unexpectedly difficult to accurately position the element chip, which is the transcriptional target, and such substrate. As one reason for this, it could be said that when the substrate of the subject to be transcribed is of a large size, the expansion and contraction of such substrate will become significant. In particular, with a print substrate or flexible print circuit, the expansion and contraction of the substrate is considerable. Further, when the substrate of the subject to be transcribed becomes a large size, it becomes necessary to enlarge the related manufacturing device. When the substrate becomes a large size, handling during the manufacture also becomes difficult.

Accordingly, an object of the present invention is to provide technology for facilitating the manufacture of a semiconductor device or electro-optic device of a large size substrate by employing the stripping-transcription technology.

Moreover, another object of the present invention is to enable the manufacture of a large size semiconductor device while employing a small size second substrate in order to facilitate the handling during the positioning or manufacture of the element chip and second substrate upon providing a semiconductor device and electro-optic device utilizing this technology.

In addition, a further object of the present invention is to provide a manufacturing method for manufacturing a semiconductor device, electro-optic device, electronics device and so on of a large size substrate employing the stripping-transcription technology.

In order to achieve the foregoing objects, the present invention is a semiconductor device (or electro-optic device) structured by forming on a first substrate a function element for carrying out the function as a circuit element, and forming a second substrate by stripping an element chip containing one or more of such function elements and transcribing this onto the second substrate, or stripping the element chip from the first substrate and transcribing it onto a third substrate, and further transcribing the element chip from the third substrate onto the second substrate in order to form a circuit on said second substrate, wherein a plurality of second substrates is disposed and connected in a tile shape in order to enlarge the circuit.

According to the foregoing structure, enabled is the manufacture of a large size semiconductor device (or electro-optic device) while employing a small size second substrate in order to facilitate the handling during the positioning or manufacture of the element chip and second substrate.

Moreover, with the foregoing semiconductor device according to the present invention, each of the circuits formed respectively on the plurality of second substrates is driven independently for each substrate. Further, each of the substrates may also be driven independently.

According to the foregoing structure, a plurality of second substrates may be reliably driven without having to be sensitive regarding the wiring delay or time constant increase of the second substrate circuit, or the second substrate itself.

Further, with the foregoing semiconductor device according to the present invention, a drive circuit is disposed on the side opposite to the side where the element chip of the second substrate is to be transcribed.

In addition, with the foregoing semiconductor device according to the present invention, the second substrate is formed with a flexible print circuit substrate, at least portions of the flexible print circuit substrates mutually overlap, and a drive circuit is disposed at such overlapping portion.

According to the foregoing structures, the side to which the element chip of the second substrate is to be transcribed may be utilized effectively.

Moreover, with the foregoing semiconductor device according to the present invention, circuits of the adjoining second substrates are connected.

According to the foregoing structure, since it is not necessary to provide a drive circuit for each second substrate, the reduction of manufacturing costs and the improvement of reliability during use can be realized.

Further, with the foregoing semiconductor device according to the present invention, the plurality of second substrates disposed in a tile shape is formed by being attached to a fourth substrate, and the mutual circuits of the second substrates are connected via the wiring (or connection means) of the fourth substrate.

In addition, with the foregoing semiconductor device according to the present invention, the plurality of second substrates disposed in a tile shape is formed by being attached to a fourth substrate, and the circuits of mutually adjoining second substrates are connected via the wiring (or connection means) of the fourth substrate.

Moreover, with the foregoing semiconductor device according to the present invention, the plurality of second substrates disposed in a tile shape is formed with a flexible print circuit substrate, at least portions of the flexible print circuit substrates mutually overlap, and the circuits of the mutual substrates are connected at such overlapping portion.

Further, with the foregoing semiconductor device according to the present invention, one type of second substrates are made to mutually overlap, and the mutual circuits thereof are connected at such overlapping portion.

In addition, with the foregoing semiconductor device according to the present invention, the second substrate is formed with a flexible print circuit, a first type of second circuit and a second type of second circuit are made to alternately overlap, and the mutual circuits are connected at the side to which the first type of second circuit and the element chip are to be transcribed, and at the side opposite to the side to which the second type of second substrate and the element chip are to be transcribed.

Moreover, with the foregoing semiconductor device according to the present invention, the flexible circuit substrate is formed with first and second flexible print circuit substrates, and, in addition to alternately disposing the first and second flexible print circuit substrates, both sides of the second flexible print circuit substrate are made to run upon and overlap with the respectively adjoining first flexible print circuit substrates so as to connect the circuits of both substrates.

Further, with the foregoing semiconductor device according to the present invention, circuits on the plurality of second substrates are mutually connected with an anisotropic conductive material.

In addition, with the foregoing semiconductor device according to the present invention, circuits on the plurality of second substrates are mutually connected with wire bonding.

Moreover, with the foregoing semiconductor device according to the present invention, a conductive material is discharged with the inkjet (droplet discharge) method to form the wiring, and circuits on the plurality of second substrates is mutually connected thereby.

Further, with the foregoing semiconductor device according to the present invention, a burying material such as an insulation material is discharged with the inkjet method in order to fill in the mutual grooves and spaces of the plurality of disposed second substrates, a conductive material is thereafter discharged with the inkjet method to form the wiring, and circuits on the mutually adjoining second substrates are connected thereby.

In addition, with the foregoing semiconductor device according to the present invention, a liquid repellent material is discharged with the inkjet method in order to form a liquid repellent line (linear liquid repellent film), a conductive material is thereafter discharged with the inkjet (droplet discharge) method to form the wiring, and circuits on the mutually adjoining second substrates are connected thereby.

Moreover, with the foregoing semiconductor device according to the present invention, circuits on the plurality of second substrates is mutually connected, or circuits of mutually adjoining second substrates are connected with an optical interconnection.

According to the foregoing structures, a specific method can be provided for mutually connecting the circuits on the plurality of second substrates. In particular, a plurality of second substrates disposed in a tile shape is attached to a single fourth substrate, and, by connecting the mutual circuits of the second substrates via the wiring of the fourth substrate, the strength of the semiconductor is improved as a result of this fourth substrate. Moreover, since it is not necessary to bend the second substrates, circuits on the plurality of second substrates can be mutually connected more reliably. Here, the plurality of second substrates may also be attached to a plurality of fourth substrates, and circuits of the mutually adjoining second substrates may be connected via the wiring of the fourth substrate. Further, when mutually connecting one type of flexible print circuit substrate, it is only necessary to prepare one type of second substrate. In addition, when mutually connecting the circuits on the plurality of second substrates with an anisotropic conductive material, circuits of the plurality of second substrates can be mutually connected more easily. Moreover, when connecting the circuits of the mutually adjoining second substrates with an optical interconnection, since it is not necessary to connect these electrically, a more accurate connection can be ensured.

Further, with the foregoing semiconductor device according to the present invention, complementary concave and convex portions are respectively formed on the adjoining second substrates, and the second substrates are disposed in a tile shape by repeatedly engaging the concave and convex portions.

According to the foregoing structure, the second substrates can be accurately disposed in a self-aligning manner.

In addition, with the foregoing semiconductor device according to the present invention, the function element is a thin film transistor.

Moreover, with the foregoing semiconductor device according to the present invention, the function element is an organic electroluminescence element.

Further, with the foregoing semiconductor device according to the present invention, an organic electroluminescence element is provided on the fourth substrate.

According to the foregoing structures, with a semiconductor device where the function element is a thin film transistor or an electroluminescence element, or comprising an electroluminescence element on the fourth substrate, enabled is the manufacture of a large size semiconductor device while employing a small size second substrate in order to facilitate the handling during the positioning or manufacture of the element chip and second substrate.

In addition, with the foregoing semiconductor device according to the present invention, laser irradiation is employed for the stripping and transcription of the element chip.

According to the foregoing method, the stripping and transcription employed in the present invention can be realized without difficulty.

Moreover, the present invention is an electro-optic device structured by comprising any one of the semiconductor devices described above.

According to the foregoing structure, in general, enabled is the manufacture of a large size semiconductor device while employing a small size second substrate in order to facilitate the handling during the positioning or manufacture of the element chip and second substrate with respect to an electro-optic device with a great demand of further enlargement. An electro-optic device shall include a liquid crystal display device, an organic EL display device and an electrophoretic element.

Further, the present invention is an electronics device employing the foregoing electro-optic device as the display unit. Here, an electronics device shall include a video camera, a television, a large size screen, a portable telephone, a personal computer, a personal data assistant (so-called PDA), as well as other types of devices.

In addition, the liquid crystal display device according to the present invention comprises: a support substrate; a liquid display panel formed by arranging on the support substrate a plurality of unit display panels structuring the unit display area of the screen; a drive circuit for driving the pixel element group of the unit display panel; and a driver IC for controlling the drive circuit.

According to the foregoing structure, a large screen liquid crystal display device can be structured.

Preferably, the foregoing drive circuit is disposed at a seal portion formed at the outer periphery of the liquid crystal display panel and for sealing the liquid crystal, or at a spacer portion formed at the mutual boundary areas of the unit display panels and for securing the retention space of the liquid crystal. Reduction in the display area caused by the installment of circuits can thereby be avoided.

Preferably, formed on the foregoing support substrate is a wiring layer responsible for the signal wiring to the respective unit display panels, and this wiring layer is used to supply a signal from the driver IC to the respective drive circuits.

Moreover, the electro-optic device according to the present invention comprises: a support substrate; a display panel formed by arranging on the support substrate a plurality of unit display panels structuring the unit display area of the screen; a drive circuit for driving the pixel element group of the unit display panel; and a driver IC for controlling the drive circuit.

According to the foregoing structure, a large screen electro-optic device can be obtained.

Preferably, formed on the foregoing support substrate is a wiring layer responsible for the signal wiring to the respective unit display panels, and this wiring layer is used to supply a signal from the driver IC to the respective drive circuits.

Further, the liquid crystal display device (electro-optic device) according to the present invention comprises: a support substrate; a display panel formed by arranging on the support substrate a plurality of unit display panels structuring the unit display area of the screen; and a drive circuit disposed at a seal portion formed at the outer periphery of the liquid crystal display panel and for sealing the liquid crystal, or at a spacer portion formed at the mutual boundary areas of the unit display panels and for securing the retention space of the liquid crystal.

According to the foregoing structure, a large size display device (large screen) can be formed by combining the unit display panels responsible for the display of a part of the entire screen. Further, by disposing the drive circuit (drive chip) at the seal portion or spacer portion, the seal portion or the like not used for forming images can be used effectively, and it is thereby possible to prevent the deterioration of the aperture efficiency of the liquid crystal display panel.

Preferably, formed on the foregoing support substrate is a wiring layer responsible for the signal wiring to the respective unit display panels, and this wiring layer is used to supply a signal from the driver IC to the respective drive circuits. Thereby, the signal wiring of a large size (liquid crystal) display panel can be secured.

Preferably, the foregoing unit display panel is structured by forming on a first substrate a function element for carrying out the function as a circuit element, and forming a second substrate by stripping an element chip containing one or more of such function elements and transcribing this onto the second substrate, or stripping the element chip from the first substrate and transcribing it onto a third substrate, and further transcribing the element chip from the third substrate onto the second substrate.

According to the foregoing structure, a unit display panel can be structured with an element chip substrate employing the stripping-transcription technology.

In addition, the manufacturing method of a semiconductor device according to the present invention comprises: a transcription substrate formation step of forming on a first substrate a circuit chip containing a thin film element or a thin film circuit via a stripping layer; a stripping-transcription step of stripping the circuit chip formed on the first substrate and transcribing this directly, or via transcription to a third substrate, to a second substrate; and a second substrate arrangement step of arranging on a base substrate, in a tile shape, a plurality of second substrates to which the circuit chip has been transcribed.

According to the foregoing structure, enabled is the manufacture of a large size semiconductor device (or electro-optic device) while employing a small size second substrate in order to facilitate the handling during the positioning or manufacture of the circuit chip and second substrate.

Preferably, the foregoing second substrate arrangement step further comprises: a connection step of electrically connecting, among the plurality of second substrates arranged in a tile shape, the mutually adjoining substrates by the wiring formed on the base substrate.

According to the foregoing structure, the second substrates can be connected electrically.

Preferably, the foregoing second substrate arrangement step further comprises: a connection step of overlapping, among the plurality of second substrates arranged in a tile shape, at least portions of the mutually adjoining second substrates, and electrically connecting the mutual second substrates adjoining at such overlapping portion.

According to the foregoing structure, the second substrates can be connected electrically at the overlapping portion.

Moreover, the manufacturing method of a semiconductor device according to the present invention comprises: a transcription substrate formation step of forming on a first substrate a circuit chip containing a thin film element or a thin film circuit via a stripping layer; a stripping-transcription step of stripping the circuit chip formed on the first substrate and transcribing this directly, or via transcription to a third substrate, to a second substrate; and a second substrate arrangement step of arranging in a tile shape a plurality of second substrates to which the circuit chip has been transcribed, disposing on a boundary of the arranged second substrates a fourth substrate for crossing the boundary, and electrically connecting the mutually adjoining second substrates via the fourth substrate.

According to the foregoing structure, the adjoining second substrates can be connected electrically.

Preferably, the electrical connection of the foregoing second substrates is performed with an anisotropic conductive material. Thereby, the substrates can be connected relatively easily.

Preferably, the foregoing second substrates are formed with a flexible print circuit. Thereby, the overlapping of substrates can be facilitated.

Further, the manufacturing method of a semiconductor device comprises: a transcription substrate formation step of forming on a first substrate a circuit chip containing a thin film element or a thin film circuit via a stripping layer; a stripping-transcription step of stripping the circuit chip formed on the first substrate and transcribing this directly, or via transcription to a third substrate, to a second substrate; a second substrate arrangement step of arranging in a tile shape a plurality of second substrates to which the circuit chip has been transcribed; and a connection step of forming a wiring with the inkjet method on the arranged second substrates and electrically connecting the mutual second substrates.

According to the foregoing structure, each of the arranged second substrates can be connected electrically.

Preferably, a liquid repellent line is formed with the inkjet method, wiring is thereafter formed with the inkjet method, and circuits on the mutually adjoining second substrates are connected thereby. As a result, a more reliable wiring with the inkjet method can be sought.

Preferably, prior to the foregoing connection step, a fill-in step for filling in the grooves or spaces between the foregoing arranged second substrates is further provided. Thereby, the disconnection of wiring with the inkjet method can be avoided.

Preferably, the foregoing second substrate arrangement step disposes the second substrates in a tile shape by preforming portions to be of a complementary shape to the two adjoining second substrates, and repeating the engagement of such complementary shape portions regarding the respective second substrates. Thereby, the position of disposing the respective second substrates can be determined uniquely.

Preferably, the foregoing thin film element is a thin film transistor or an organic electroluminescence element. Stripping and transcription can be applied easily to a thin film element or a thin film circuit.

DESCRIPTION OF THE PREFERRED EMBODIMENTS

The preferred embodiments of the present invention are now explained.

(First Embodiment)

FIG. 1 is a process chart for explaining the manufacturing process of the semiconductor device of the first embodiment according to the present invention.

Figure 1A:
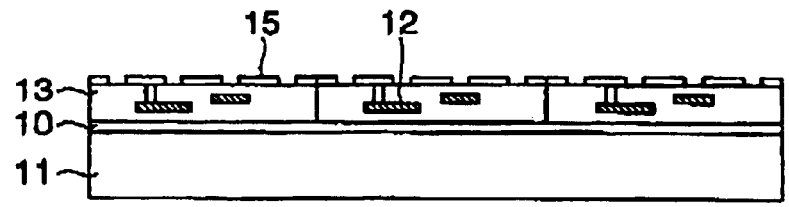
FIG. 1A to FIG. 1D are diagrams showing the manufacturing method of the semiconductor device of the first embodiment according to the present invention.

Foremost, as shown in FIG. 1A, a plurality of function element chips 13 containing one or more function elements 12 is formed on a transparent first substrate 11 such as a quartz glass via a stripping layer 10 such as amorphous silicon. A first pad 15 formed of a conductive material is formed on the respective function element chips 13 as a terminal for circuit connection.

Figure 1B:
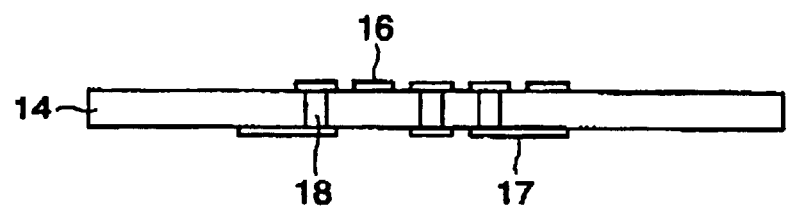

FIG. 1B shows the second substrate to which the function element chip 13 is to be transcribed. The second substrate 14 is, for example, a print wiring circuit substrate, and formed on the upper face thereof is a second pad 16 formed of a conductive material, and formed on the lower face thereof are a wiring 17, and a via plug 18 (conductive material for filling in the via holes) for connecting the second pad 16 and the wiring 17.

Figure 1C:
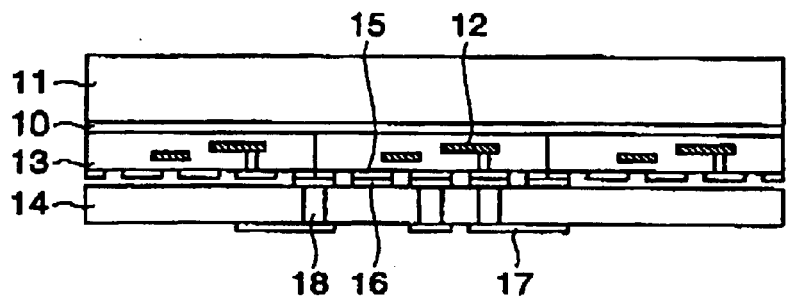
Figure 1D:
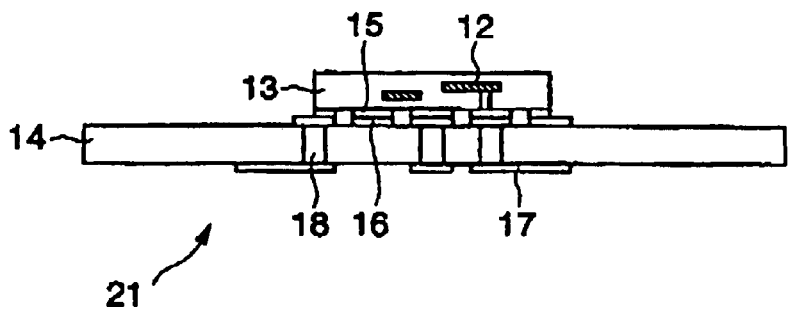

Next, as shown in FIG. 1C, the first substrate 11 and second substrate 14 are attached to each other, the pad 15 of the function chip 13, which is to be the target of transcription, and the pad 16 of the second substrate 14 are connected, and the circuit of the function chip 13 and the circuit wiring of the second substrate 14 are connected. Then, the function element chip 13 to be the target of transcription is attached to the second substrate 14 via an attachment means such as an adhesive agent.

Thereafter, as shown in FIG. 1C, the element chip 13 is stripped from the first substrate 11 and transcribed to the second substrate 14 side with the substrate stripping-transcription technology.

In other words, an abrasion is generated by irradiating laser from the back face of the first substrate 11 onto the stripping layer 10 of the bedding of the function element chip 13, which is to be the subject of transcription, and the function element chip 13 and the first substrate 11 are isolated thereby. The function element chip 13 is fixed to the second substrate 14 side via an adhesive (or joining) means such as an adhesive agent, the first substrate is separated from the second substrate, and the function element chip 13 is stripped from the first substrate 11 and moved to the second substrate 14 side. Stripping-transcription technology will be described later in detail.

A semiconductor is formed upon stripping an element chip 13 containing one or more function elements 12, transcribing this onto the second substrate 14, and connecting the circuit on the element chip 13 and the circuit on the second substrate 14. The circuit on the element chip 13 and the circuit on the second substrate 14 are connected by providing conduction between the first pad 15 and the second pad 16. Conduction between the first pad 15 and the second pad 16 may be provided before or after the stripping and transcription.

In this manner, the function element 13 is transcribed to the second substrate 14 in order to form the chip-transcribed second substrate 21.

Figure 2:
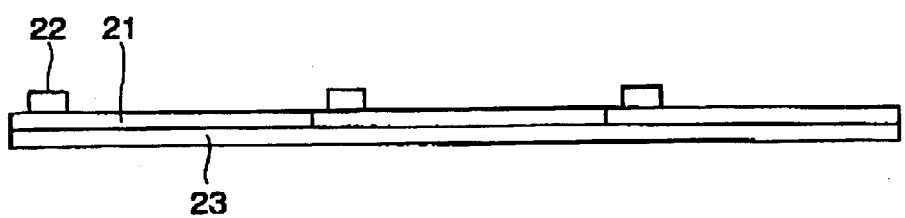
FIG. 2 is a diagram showing the structure of the semiconductor device of the first embodiment according to the present invention.

Next, as shown in FIG. 2, by further disposing or arranging, in a tile shape, a plurality of chip-transcribed second substrates 21 on a support substrate 23, an even larger semiconductor device can be formed.

As illustrated in FIG. 2, a plurality of chip-transcribed second substrates 21 is disposed in a tile shape so as to enlarge the semiconductor device. Each of these chip-transcribed second substrates 21 independently receives the supply of power and signals, and the circuits, pixels and the like mounted thereon can be driven independently. The supply of power and signals can be realized via the wiring formed on the base substrate 23. Moreover, as described later, wiring may be further formed on the arranged chip-transferred second substrates 21 in order to supply power and signals. In the illustrated example, the drive circuit 22 is disposed on the face on the opposite side of the face to which the element chip was transcribed on the chip-transcribed second substrate 21. Thereby, each of the chip-transcribed second substrates 21 can be driven independently.

Moreover, materials such as the first substrate 11, function element 12, element chip 13, second substrate 14, first pad 15, second pad 16, wiring 17, and via plug 18, as well as the manufacturing method, structure and the like described above can be replaced with other means, materials and equivalents thereof, and all of the above are within the scope of spirit of the present invention. Further, the support substrate 23 is not essential, and may be disregarded.

(Second Embodiment)

FIG. 3A to FIG. 3E are process charts for explaining the manufacturing process of the semiconductor device of the second embodiment according to the present invention. In this example, a third substrate (temporary transcription substrate) is used.

Figure 3A:
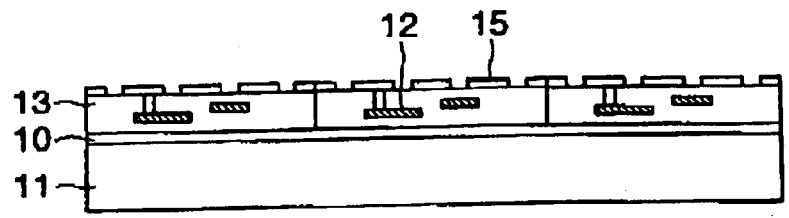
FIG. 3A to FIG. 3E are diagrams showing the manufacturing method of the semiconductor device of the second embodiment according to the present invention.

Foremost, as shown in FIG. 3A, a stripping layer 10 such as amorphous silicon is formed on a transparent first substrate 11 such as a quartz glass. Then, a plurality of function element chips 13 containing one or more function elements 12 is formed thereon.

Figure 3B:
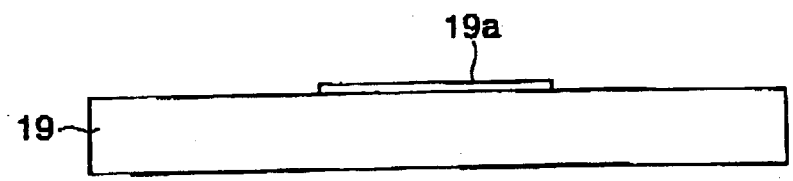

As shown in FIG. 3B, a temporary adhesive layer 19a is formed on the third substrate 19 as a temporary transcription substrate.

Figure 3C:
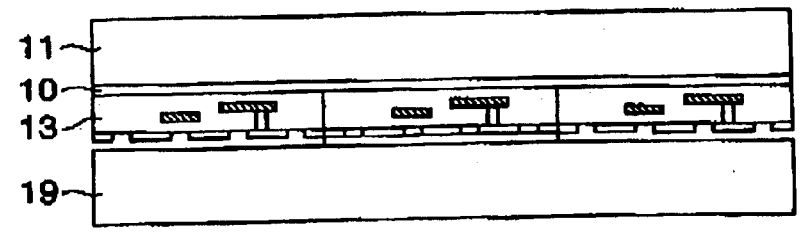

As shown in FIG. 3C, the first substrate 11 and the third substrate 19 are attached to each other via the temporary adhesive layer 19a. An abrasion is generated upon irradiating laser from the back face of the first substrate 11 onto the stripping layer 10 of the bedding of the function element chip 13, which is to be the subject of transcription. The first and third substrates are separated, the function element chip 13 is stripped from the first substrate 11, and then temporarily transcribed to the third substrate 19.

Figure 3D:
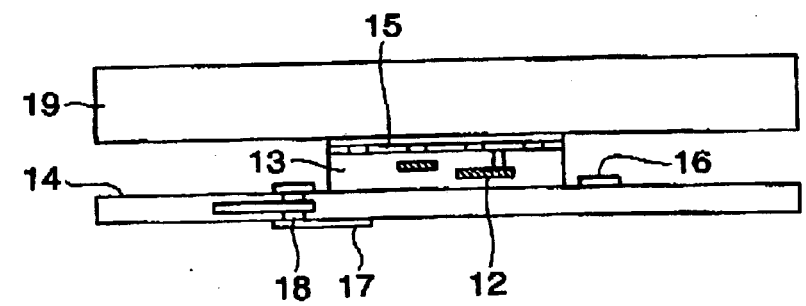

Next, as shown in FIG. 3D, an adhesive agent is applied to the function element chip 13 temporarily transcribed to the third substrate 19 for attachment to the second substrate 14. The second substrate, for example, is a flexible print circuit of a multilayer wiring, and, as described above, the second pad 16, wiring 17, via plug 18 and the like are formed thereon.

Figure 3E:
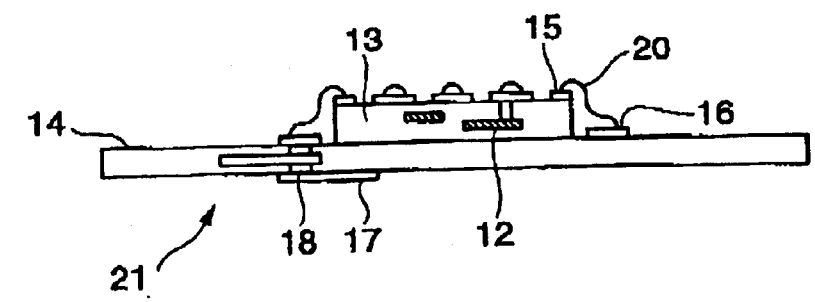

As shown in FIG. 3E, adhesive power of the temporary adhesive layer 19a is bereaved by the laser irradiation or the like from the back face of the third substrate 19. The third substrate is separated from the second substrate, and the function chip 13 is stripped from the third substrate and transcribed to the second substrate 14 side. The pad 15 of the function chip 13 and the pad 16 of the second substrate 14 are connected with a metal or aluminum pad wiring 20. The circuit on the element chip 13 and the circuit on the second substrate 14 are connected by providing conduction between the first pad 15 and the second pad 16. In addition, as described later, connection with the electrical circuit and wiring of the substrate 14 can also be made with a connection means other than wire bonding.

In this manner, the chip-transcribed second substrate 23 having mounted thereon the function element chip 13 is formed.

Figure 4:
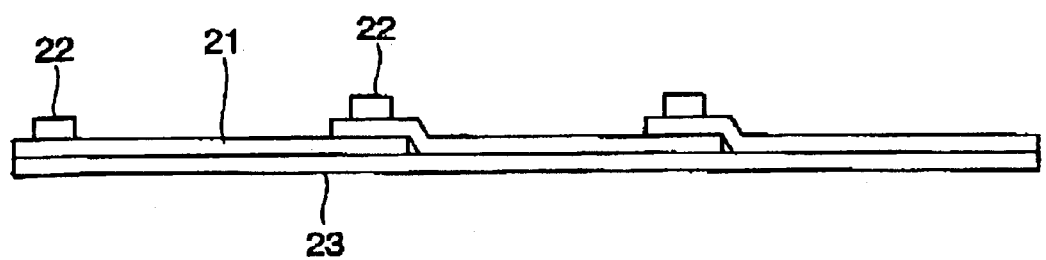
FIG. 4 is a diagram showing the structure of the semiconductor device of the second embodiment according to the present invention.

Next, as shown in FIG. 4, by further disposing or arranging, in a tile shape, a plurality of chip-transcribed second substrates 21 on a support substrate 23, an even larger semiconductor device can be formed.

With the example illustrated in FIG. 4, one side of the chip-transcribed second substrate 21 is made to partially run upon the adjoining chip-transcribed substrate 21. Circuits of both substrates may be connected at the portion where these substrates 21 overlap. In this embodiment also, each of the plurality of chip-transcribed second substrates 21 is independently driven. The drive circuit 22 is disposed on the face on the opposite side of the face to which the element chip was transcribed on the chip-transcribed second substrate 21. Moreover, the chip-transcribed second substrate 21 is formed of a flexible printed circuit (FPC), a plurality of second substrates is made to mutually overlap, and the drive circuit 22 is disposed at such overlapping portion. Further, in the foregoing case, although the chip-transcribed second substrates are laminated at the end portions thereof, it is preferable that the drive circuit 22 is disposed between the end portions of the chip-transcribed second substrates 21 overlapping respectively.

Moreover, materials such as the first substrate 11, function element 12, element chip 13, second substrate 14, first pad 15, second pad 16, wiring 17, and via plug 18, as well as the manufacturing method, structure and the like described above can be replaced with other means, materials and equivalents thereof, and all of the above are within the scope of spirit of the present invention. Further, the support substrate 23 is not essential, and may be disregarded.

(Third Embodiment)

Figure 5:
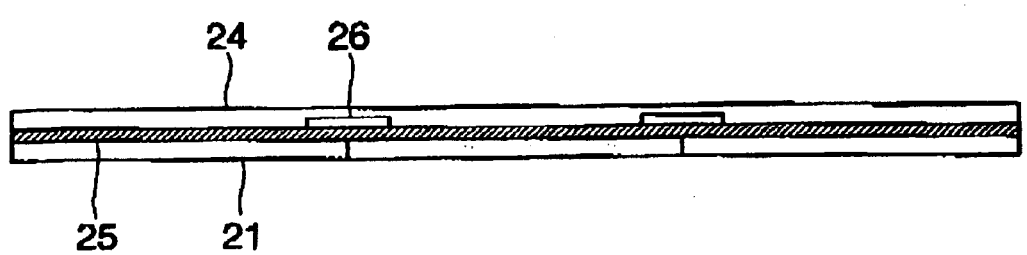
FIG. 5 is a diagram showing the structure of the semiconductor device of the third embodiment according to the present invention.

FIG. 5 is a diagram showing the structure of the semiconductor device of the third embodiment according to the present invention. The chip-transcribed second substrate 21 and the manufacturing process thereof are approximately the same as the first and second embodiments described above.

In the present embodiment, the circuits mounted between the plurality of chip-transcribed second substrates 21 are mutually connected. Moreover, the chip-transcribed second substrates 21 disposed in a tile shape area attached to a single fourth substrate 24, and the circuit on the second substrate 21 is connected thereto via the anisotropic conductive material 25 and connection wiring 26 formed on the fourth substrate 24. Further, the support substrate 23 may also serve as the fourth substrate 24. Here, it is preferable that a concave portion is provided such that a connection wiring 26 can be formed on the fourth substrate 24. Thereupon, the center of the concave portion may be positioned at the joint of the chip-transcribed substrates 21 disposed in a tile shape.

(Fourth Embodiment)

Figure 6:
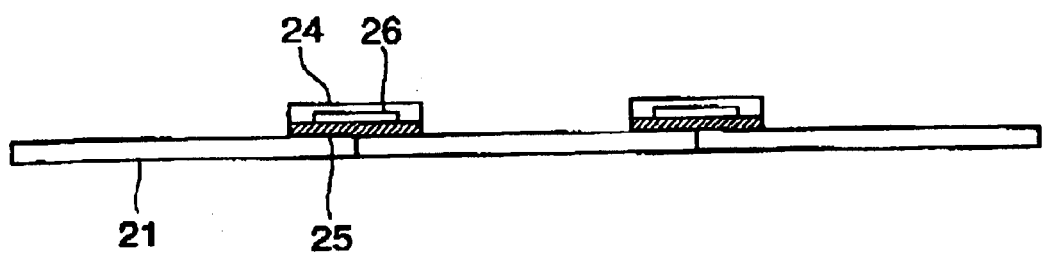
FIG. 6 is a diagram showing the structure of the semiconductor device of the fourth embodiment according to the present invention.

FIG. 6 is a diagram showing the structure of the semiconductor device of the fourth embodiment according to the present invention. The second substrate 21 and the manufacturing method thereof are approximately the same as the first and second embodiments. In the present embodiment, circuits on the plurality of chip-transcribed second substrates 21 are mutually connected. Further, a plurality of fourth substrates 24 is attached to the chip-transcribed second substrates disposed in a tile shape, and the circuit on the chip-transcribed second substrate 21 is connected thereto via the anisotropic conductive material 25 and connection wiring 26 formed on the fourth substrate 24.

Moreover, materials such as the chip-transcribed second substrate 21, fourth substrate 24, anisotropic conductive material 25, and connection wiring 26, as well as the manufacturing method, structure and the like described above can be replaced with other means, materials and equivalents thereof, and all of the above are within the scope of spirit of the present invention.

(Fifth Embodiment)

Figure 7:
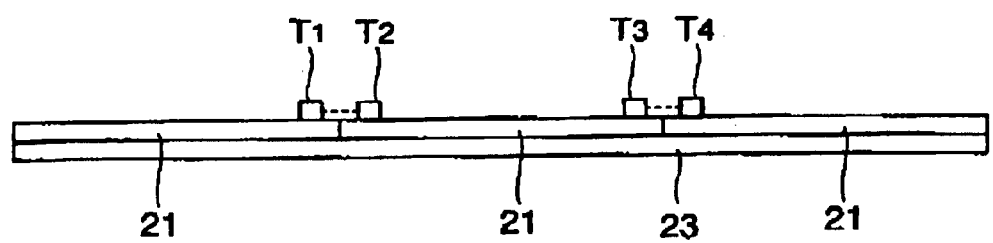
FIG. 7 is a diagram showing the structure of the semiconductor device of the fifth embodiment according to the present invention.

FIG. 7 is a diagram showing the structure of the semiconductor device of the fifth embodiment according to the present invention. The chip-transcribed second substrate 21 and the manufacturing method thereof are approximately the same as the first and second embodiments. In the present embodiment, a plurality of chip-transcribed second substrates 21 is arranged in a tile shape on the substrate 23. Further, optical transceivers (optical transmitter, optical receiver) T1, T2, T3 . . . Tn are respectively disposed between the mutually arranged chip-transcribed second substrates 21, and these are mutually connected via an optical interconnection (optical cross connection).

Moreover, a required number of optical transceivers may be disposed. In addition, data signals of graphics and the like can be transmitted as serial signals in order to reduce the number of optical signals (number of transceivers).

(Sixth Embodiment)

Figure 8:
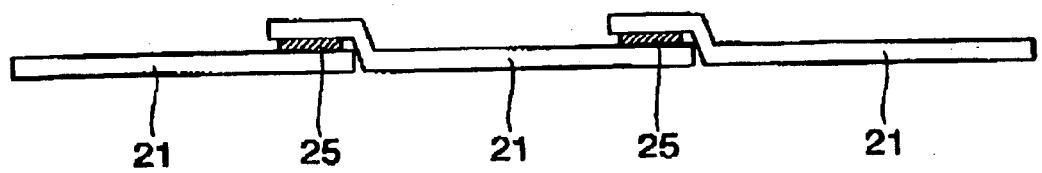
FIG. 8 is a diagram showing the structure of the semiconductor device of the sixth embodiment according to the present invention.

FIG. 8 is a diagram showing the structure of the semiconductor device of the sixth embodiment according to the present invention. The chip-transcribed second substrate 21 and the manufacturing method thereof are the same as the first and second embodiments.

In the present embodiment, the chip-transcribed second substrate 21 is formed with a flexible print circuit. A plurality of chip-transcribed second substrates 21 is made to mutually overlap, and the mutual circuits thereof are connected at the overlapping portion via the anisotropic conductive material 25. Further, in this embodiment, one type of a plurality of chip-transcribed second substrates 21 is made to mutually overlap in a roof tile shape.

Moreover, materials such as the chip-transcribed second substrate 21, fourth substrate 24, anisotropic conductive material 25, and connection wiring 26, as well as the manufacturing method, structure and the like described above can be replaced with other means, materials and equivalents thereof, and all of the above are within the scope of spirit of the present invention.

(Seventh Embodiment)

Figure 9:
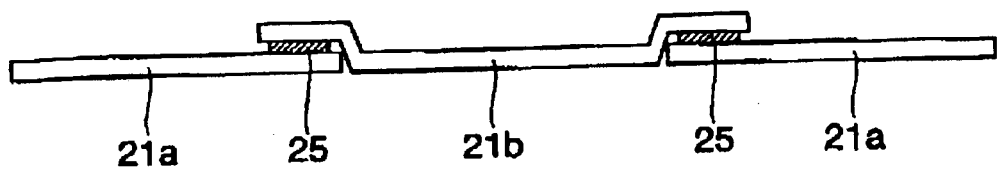
FIG. 9 is a diagram showing the structure of the semiconductor device of the seventh embodiment according to the present invention.

FIG. 9 is a diagram showing the structure of the semiconductor device of the seventh embodiment according to the present invention. The chip-transcribed second substrate 21 and the manufacturing method thereof are the same as the first and second embodiments.

In the present embodiment, the chip-transcribed second substrate 21 is formed with a flexible print circuit. A plurality of chip-transcribed second substrates 21 is made to mutually overlap, and the mutual circuits thereof are connected at the overlapping portion via the anisotropic conductive material 25. Further, a first type of chip-transcribed second substrate 21a having a planar shape and a second type of chip-transcribed second substrate 21b having a shape where both ends thereof are raised are disposed alternately. The chip-transcribed second substrate 21b is made to run upon and overlap with the chip-transcribed second substrate 21a at each of such both ends, and, the mutual circuits are connected at the face of the side where the chip element of the first type of chip-transcribed second substrate 21a is transcribed, and the face on the opposite side of the side where the chip element of the second type of chip-transcribed second substrate 21b is transcribed.

And, by respectively forming complementary concave and convex portions on the adjoining chip-transcribed second substrates 21a and 21b, and repeatedly engaging such concave and convex portions, the chip-transcribed second substrates are disposed in a tile shape.

Moreover, materials such as the chip-transcribed second substrate 21, fourth substrate 24, anisotropic conductive material 25, and connection wiring 26, as well as the manufacturing method, structure and the like described above can be replaced with other means, materials and equivalents thereof, and all of the above are within the scope of spirit of the present invention.

Further, with the third to seventh embodiments, circuits on the plurality of chip-transcribed second substrates are mutually connected with the anisotropic conductive material 25 or optical coupling. Nevertheless, circuits on the plurality of chip-transcribed second substrates 21 may also be mutually connected via wire bonding.

In addition, circuits on the plurality of chip-transcribed second substrates 21 may also be mutually connected upon forming a wiring with the inkjet method.

Moreover, circuits on the plurality of second substrates 21 may also be mutually connected upon filling in the grooves and spaces between the chip-transcribed second substrates 21 with the inkjet method, and thereafter forming a wiring by discharging a conductive wiring material with the inkjet method.

Further, circuits on the plurality of second substrates 21 may also be mutually connected upon forming a liquid repellent line (linear liquid repellent film) by discharging a liquid repellent material with the inkjet method, and thereafter reliably forming a wiring by discharging a conductive material between the liquid repellent lines with the inkjet method.

In addition, circuits on the plurality of chip-transcribed second substrates 21 may also be connected in a non-contact form (optical emitter, optical receiver) with an optical interconnection (optical cross connection).

Moreover, with the first to seventh embodiments, concave portions and convex portions of a respective complementary shape may be formed on the adjoining chip-transcribed second substrates 21, and these concave and convex portions may be engaged in order to connect the chip-transcribed second substrates 21 and to dispose them in a tile shape.

Further, with the first to seventh embodiments, the function element 12 may be a thin film transistor. The function element 12 may also be an organic electroluminescence element.

In addition, with the foregoing third embodiment, an organic electroluminescence element may be provided on the fourth substrate 24.

(Eighth Embodiment)

Figure 10:
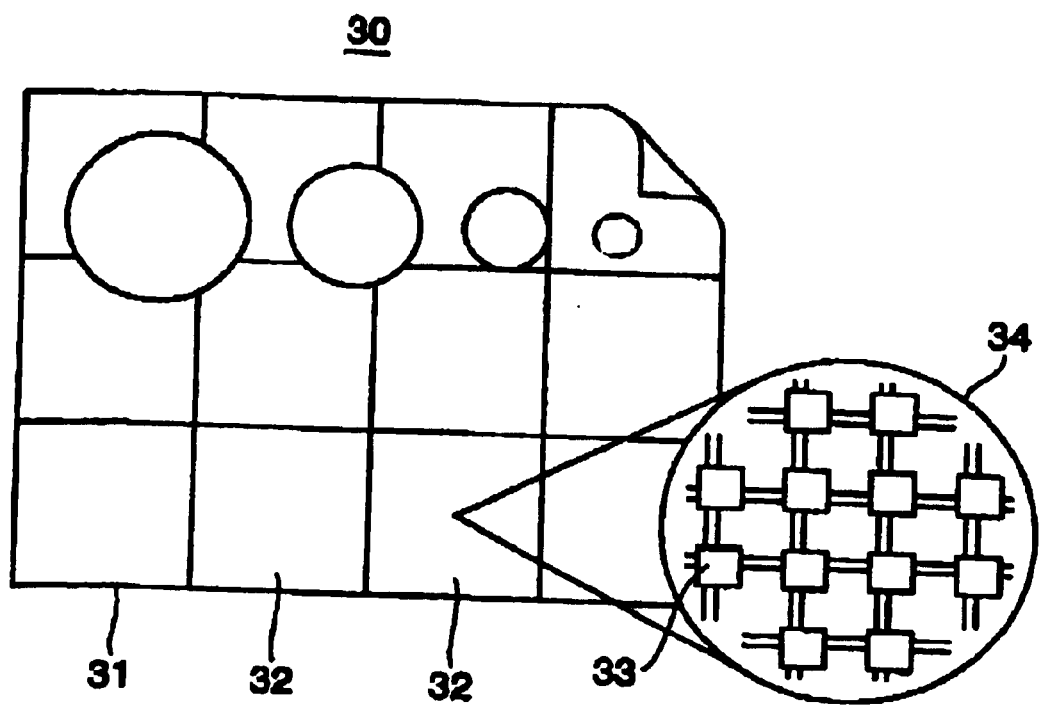
FIG. 10 is a diagram for explaining the structure of a display element of the electro-optic device of the eighth embodiment according to the present invention.

FIG. 10 is a diagram showing the structure of the display element of an electro-optic device 30 of the eighth embodiment according to the present invention. A semiconductor device having a structure or manufacturing method approximately the same as any one of the first to seventh embodiments is employed.

As shown in FIG. 10, a display area 31 is structured with a plurality of chip-transcribed second substrates 32. Element chips 33 are disposed on the chip-transcribed second substrates 32 in a matrix shape, and a wiring 34 is formed in a lattice shape.

According to the foregoing structure, since the electro-optic device 30, in general, has a larger areal ratio of the wiring and support substrate for the function element 33 in comparison to the function element itself, the effect of reducing manufacturing costs will become more effective by separately preparing the wiring and support substrate and disposing the function element only at the required portions. An organic EL display device and liquid crystal display device, for instance, correspond to the electro-optic device 30. A large screen display device can be realized by employing a plurality of (multiple) chip-transcribed second substrates.

(Example of Stripping-Transcription Method)

Figure 11A:
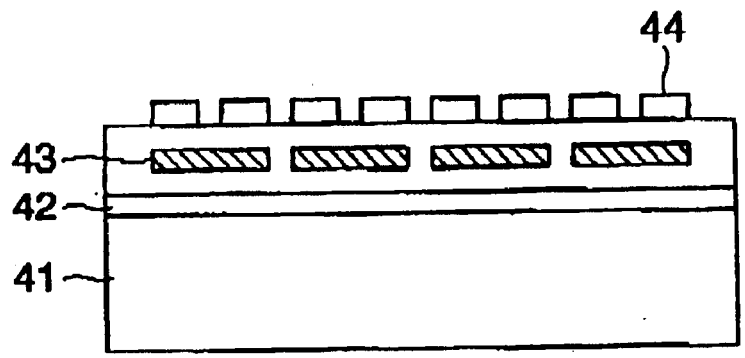
FIG. 11A to FIG. 11C are diagrams showing an example of the stripping-transcription method according to the present invention.
Figure 11B:
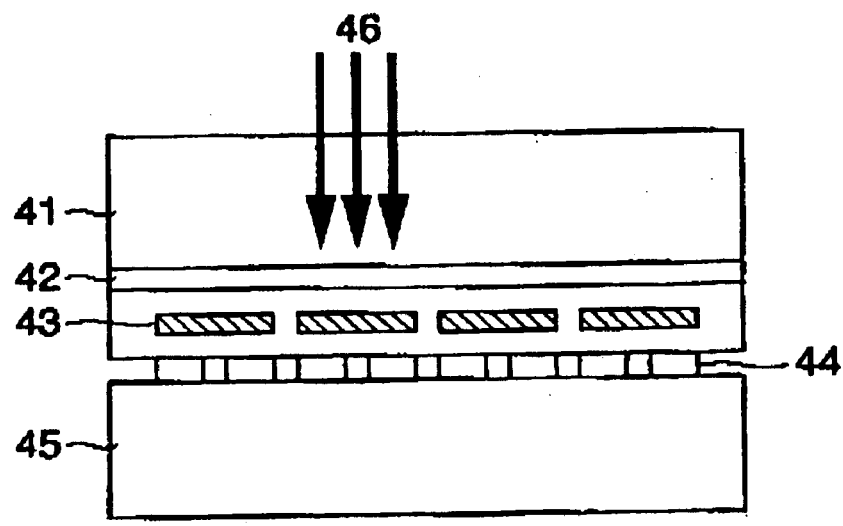
Figure 11C:
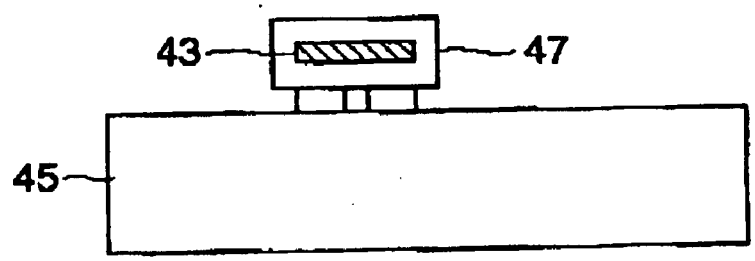

FIG. 11A to FIG. 11C are explanatory diagrams for explaining the stripping-transcription technology employed in the present invention.

Foremost, as shown in FIG. 11A, an amorphous silicon film 42 is deposited on a first substrate 41 formed of quartz or glass with PECVD employing SiH4 or LPCVD employing Si2H6. Next, a function element 43 is formed thereon. A first pad 44 is formed on the uppermost layer.

As shown in FIG. 11B, this is turned upside down, this is attached to a second substrate 45, and the laser 46 is thereby irradiated only to the element chip 47 to which stripping and transcription is to be performed via the transparent first substrate 41 formed of quartz or glass.

Then, as shown in FIG. 11C, the amorphous silicon film 42 is abraded and stripped only at the portion irradiated with the laser 46, and the element chip 47 is transcribed to the second substrate 45. Irradiation of the laser 46 is employed for the stripping and transcription of the element chip 47. According to the foregoing structure, the stripping and transcription of the element chip 47 can be carried out reliably.

(Example of Manufacturing Method of Thin Film Transistor)

Figure 12A:
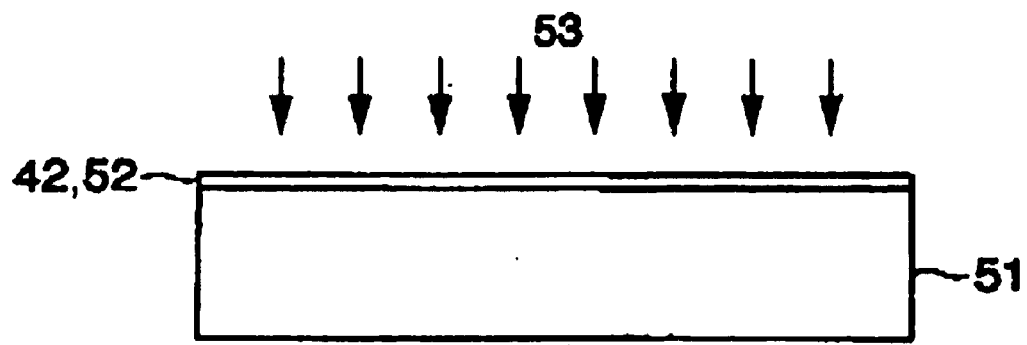
FIG. 12A to FIG. 12C are diagrams showing an example of the manufacturing method of a thin film transistor according to the present invention.
Figure 12B:
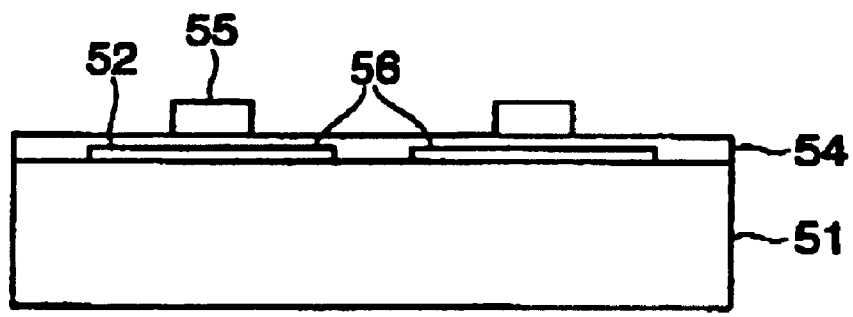
Figure 12C:
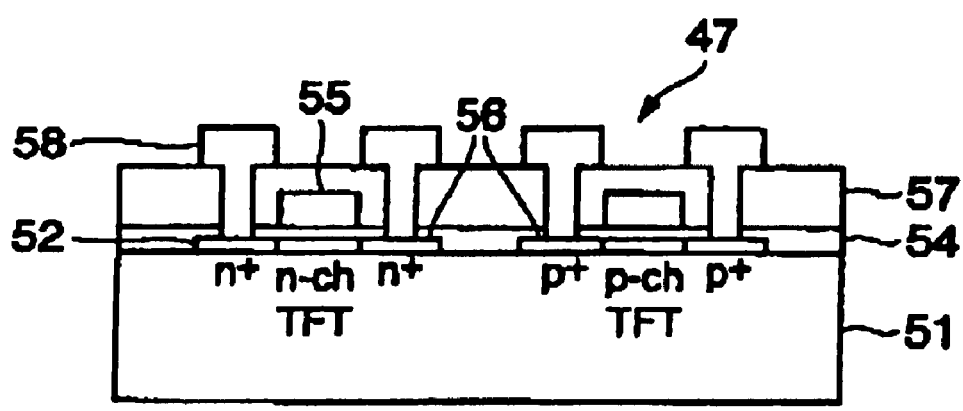

FIG. 12A to FIG. 12C are process charts for explaining an example of the manufacturing process of the function element chip 47. This example explains the manufacturing process regarding the thin film transistor as an example of the function element. Here, exemplified is a laser-crystallized polycrystal thin film transistor.

Foremost, as shown in FIG. 12A, an amorphous silicon film 42 is deposited on a first substrate formed of quartz or glass with PECVD employing SiH4 or LPCVD employing Si2H6. As a result of performing heat treatment to this amorphous silicon film by irradiating the laser 53, the amorphous silicon film will crystallize, and become a polycrystal silicon film 52.

As shown in FIG. 12B, after patterning the polycrystal silicon film 52, a gate insulation film 54 is deposited, and a gate electrode 55 is deposited and patterned. Impurities such as phosphorous and baron are embedded in the polycrystal silicon film 52 in a self-aligning manner with the gate electrode 55, activated thereafter, and a CMOS structure source area and drain area 56 are formed thereby.

As shown in FIG. 12C, an interlayer insulation film 57 is deposited, a contact hole is opened, and the source electrode and drain electrode 58 are deposited and patterned thereby.

In this manner, the thin film transistor chip 47 is formed on the first substrate.

(Example of Manufacturing Method of Organic Electroluminescence Element)

FIG. 13 is an explanatory diagram for explaining the manufacturing process regarding the organic electroluminescence element as an example of a function element.

Figure 13A:
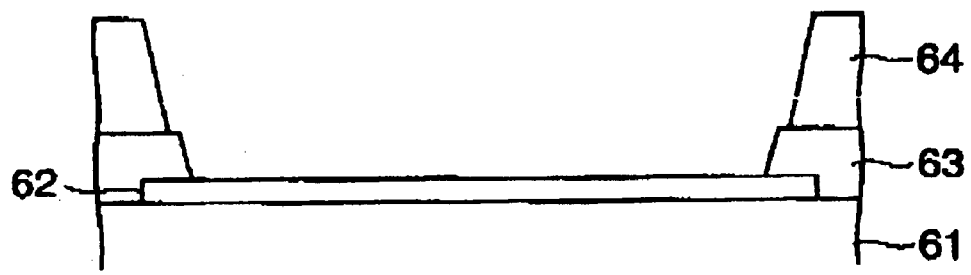
FIG. 13A and FIG. 13B are diagrams showing an example of the manufacturing method of an organic electroluminescence element according to the present invention.

Foremost, as shown in FIG. 13A, a transparent electrode 62 is deposited on a first substrate 61 formed of quartz or glass, a cohesive layer 63 is deposited, and an opening is formed at the area from which light is to be emitted. A bank 64 is deposited with polyamide or acryl, and an opening is formed at the area from which light is to be emitted.

Figure 13B:
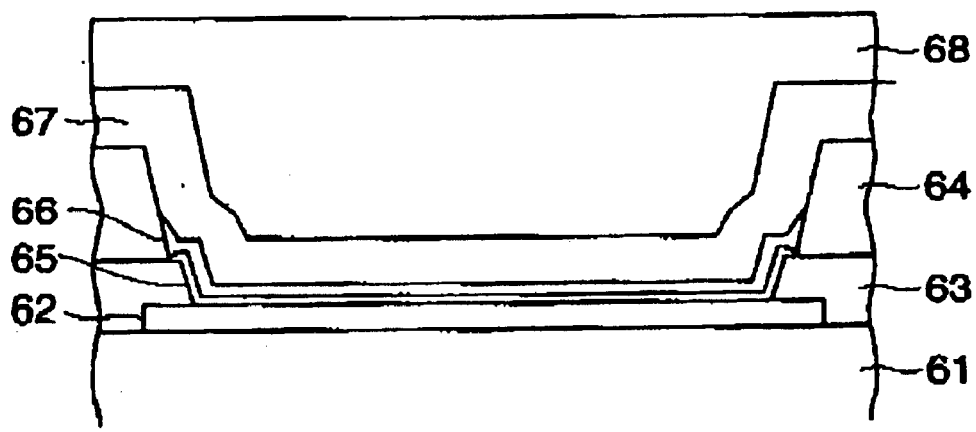

Next, as shown in FIG. 13B, the wettability of the substrate surface is controlled by plasma processing of oxygen plasma, CF4 plasma, or the like. Thereafter, the electron injection layer 65 and the luminescent layer 66 are deposited with a liquid phase process such as spin coating, squeegee coating, inkjet processing or the like, or with a vacuum process such as sputtering, deposition or the like. A cathode 67 containing alkali metals is deposited in order to reduce the work function, and this is sealed with a sealing agent 68 in order to complete the process.

Moreover, the example of the manufacturing process of the present organic electroluminescence element may also be employed as the manufacturing method of the organic electroluminescence element to be formed on the fourth substrate.

(Ninth Embodiment)

Figure 14:
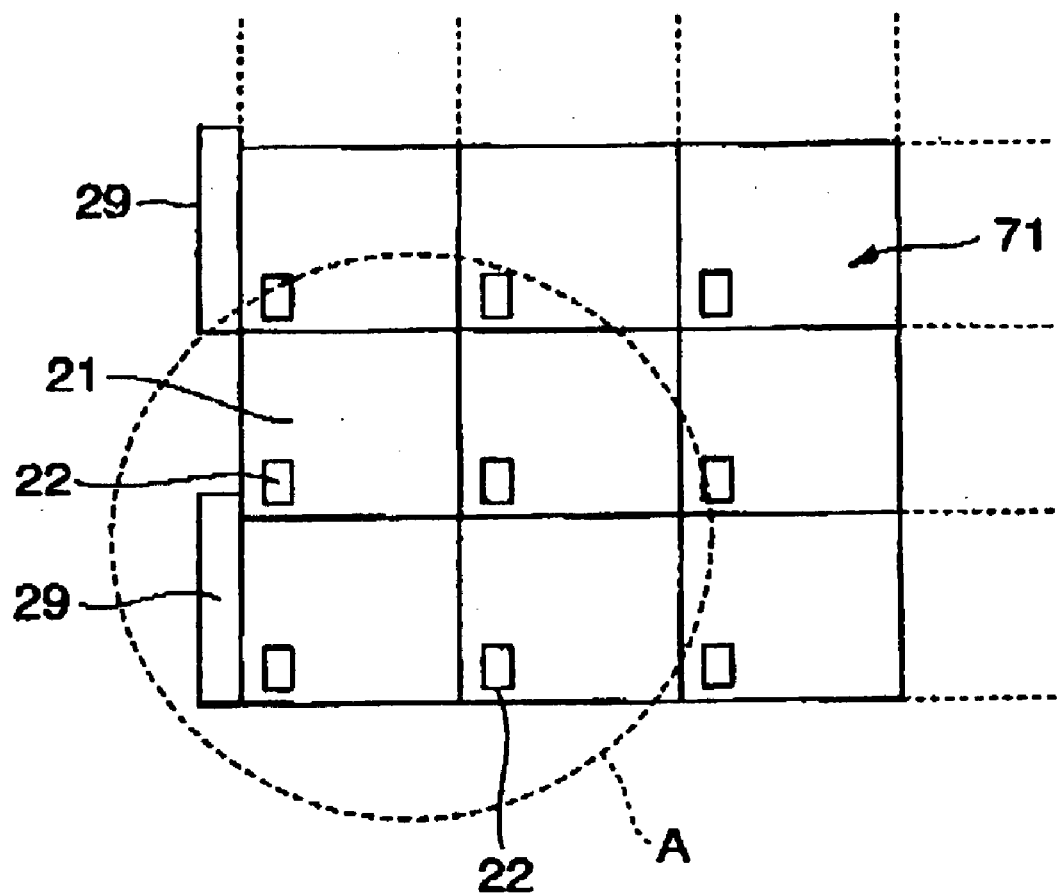
FIG. 14 is an explanatory diagram for explaining an example of forming a large screen display device of the eighth embodiment according to the present invention.

FIG. 14 and FIG. 15 are explanatory diagrams for explaining an example of forming a large screen display device with the present invention. In this example, exemplified as a specific display device is a liquid crystal display device, which is an electro-optic device.

As shown in FIG. 14, with the large screen liquid crystal display device 70, similar to the example illustrated in FIG. 10, a large screen display area is structured by combining a plurality of unit display panels 71. Each of these unit display panels 71 disposed in a line-column shape is structured with the chip-transcribed second substrate 21 (corresponds to reference numeral 32 in FIG. 10). An element chip for driving a plurality of picture electrodes (not shown) arranged in a line-column shape is disposed for each picture electrode on the unit display panel 71. Each of the element chips is driven with the drive circuit 22 provided for each unit display panel 71 via a lattice shaped wiring.

Provided to the liquid crystal display device 70 is a driver IC 29 for supplying the overall image information (picture signals) to be displayed on the large screen display area. As a result of this driver IC 29, image information of the entire screen is divided into a plurality of small screen areas, and the image information of the respective small screens is delivered to the drive circuit 22 of the corresponding unit display panel 71. The drive circuit 22 assigns the small screen image information to the respective pixels of the unit display panel 71, and controls the operation of the respective element chips. A large screen display device can be structured as a result of the above.

Moreover, a plurality of driver ICs 29 may be disposed on one side in correspondence with the size of the substrate 23 (or display screen). Further, by employing a serial transmission or bus line format, the structure may be such that a part of the wiring between the driver IC 29 and the plurality of drive circuits 22 driven is shared.

Figure 15A:
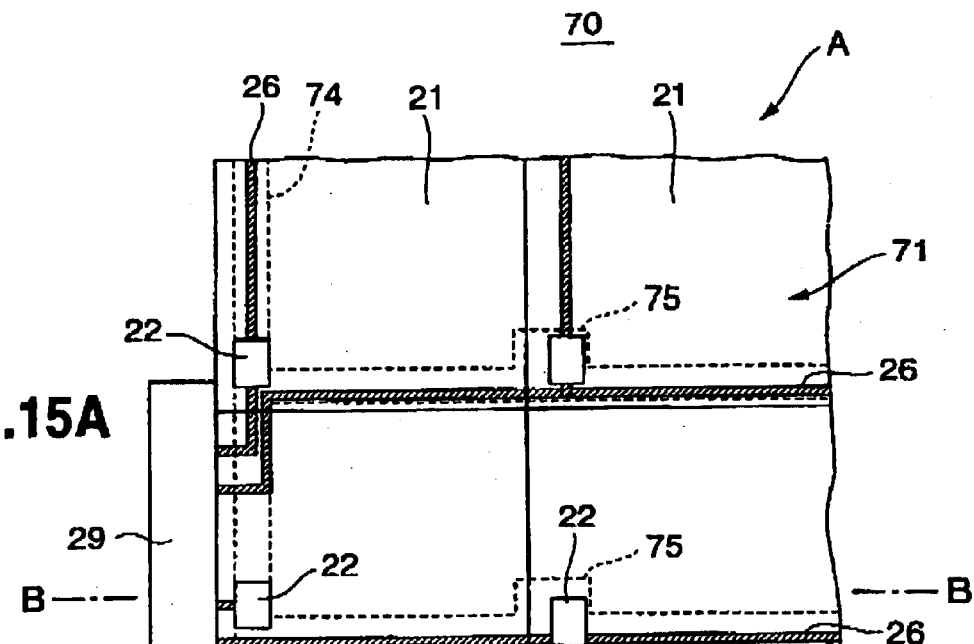
FIG. 15A is a partial enlarged view and FIG. 15B is a cross section thereof for explaining an example of forming a large screen display device of the eighth embodiment according to the present invention.

FIG. 15A is an explanatory diagram in which section A shown with the dotted line in FIG. 14 is enlarged. In addition, FIG. 15B schematically shows the cross section in the B—B direction of FIG. 15.

Figure 15B:
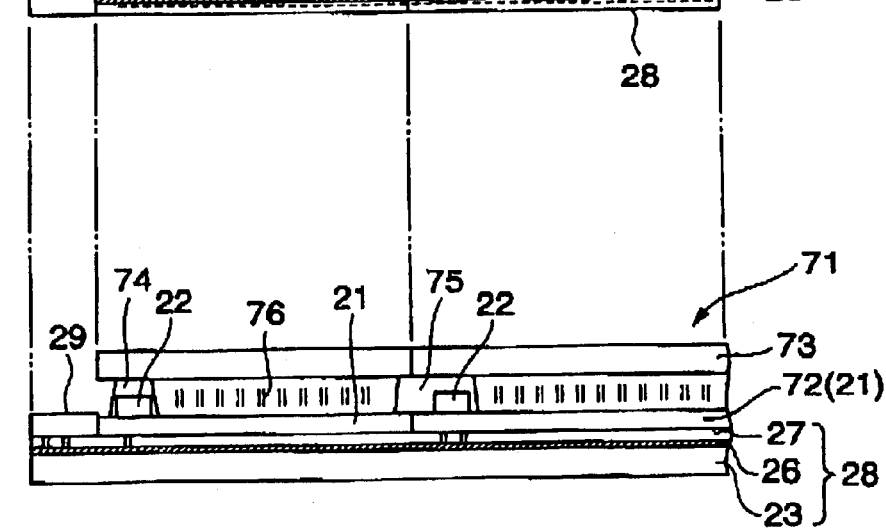

As shown in FIG. 15A and FIG. 15B, the unit display panel 71 is structured such that it secures space between the so-called TFT array substrate 72 and the color filter substrate 73 via a seal member 74 and spacer 75, and retains the liquid crystal 76 in such space. The TFT array substrate 72 is formed with the chip-transcribed second substrate 21, and a plurality of these is arranged in a line-column shape on a fifth substrate 28 to which wiring has been preformed. The fifth substrate 28 is structured by including the support substrate 23, a wiring film 26 responsible for the connection pattern connecting the driver IC 29 and the respective drive circuits 22 formed thereon, and an insulation film 27 for insulating this wiring film 26. The wiring pattern formed on the fifth substrate 28 is formed in correspondence with the disposition pattern of the seal member 74 and spacer 75, and consideration is given such that the aperture efficiency of the display pixels will not deteriorate. The drive circuit 22 and the wiring 26 of the chip-transcribed second substrate 21 are connected via the via plug formed on the substrate 21 and the insulation film 27.

A transparent electrode, color filter, orientation film and so on (which are not shown) are formed on the arranged color filter substrates 73. The color filter substrates 73, for instance, are sealed with an adhesive member. The drive circuit 22 provided to the unit display panel 71 is disposed, preferably, inside the seal member 74 or spacer 75.

According to the embodiment described above, since a large screen is formed by arranging unit display panels 71, which contain an element transcription substrate (TFT array) and color filter, on the pre-wired fifth substrate, such large screen can be manufactured without having to use large size TFT panel manufacturing equipment in which the development thereof is technically difficult.

(Tenth Embodiment)

Figure 16:
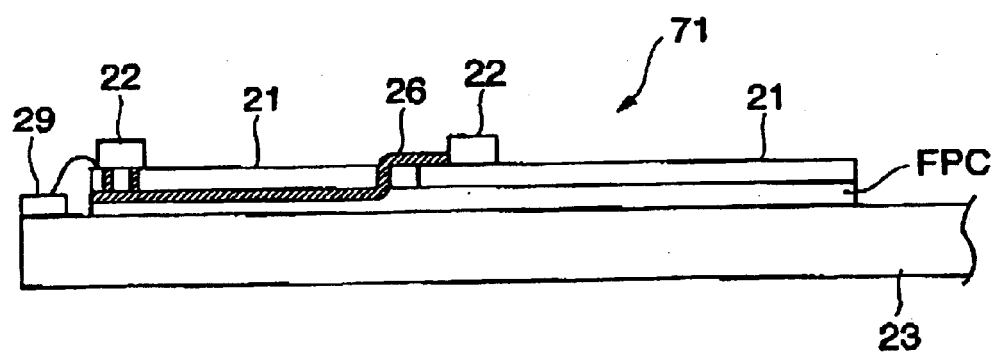
FIG. 16 is an explanatory diagram for explaining the ninth embodiment according to the present invention.

FIG. 16 shows the tenth embodiment. In FIG. 16, the components corresponding to those in FIG. 14 and FIG. 15 are given the same reference numerals, and the explanation thereof is omitted.

In this example, a flexible print circuit (FPC) substrate is used as the chip-transcribed second substrate 21, and, as a result of connecting the driver IC 29 and the drive circuit 22 of the adjoining substrates 21 with the wiring formed within this flexible substrate FPC, it is no longer necessary to form a wiring film on the support substrate. Moreover, as a result of making a large size FPC substrate the target of transcription, it is possible to form a thin film display device and the like not requiring the support substrate 23. Here, a reflective liquid crystal panel, a top emission organic EL panel and the like correspond to the unit display panel 21.

(Eleventh Embodiment)

Figure 17:
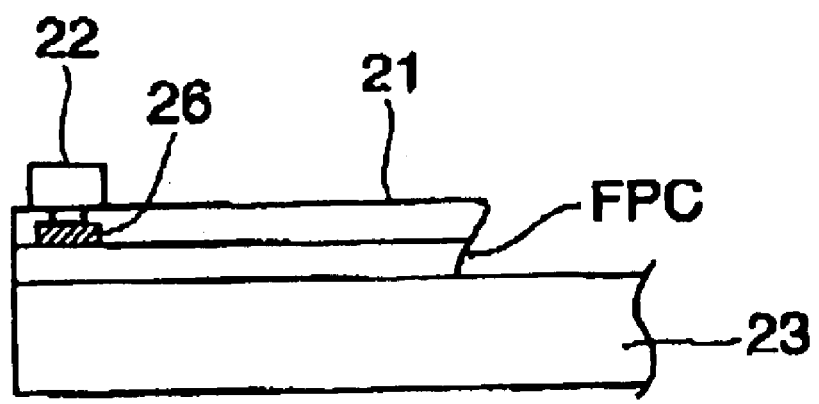
FIG. 17 is an explanatory diagram for explaining the tenth embodiment according to the present invention.

FIG. 17 shows the eleventh embodiment. In FIG. 17, the components corresponding to those in FIG. 14 and FIG. 15 are given the same reference numerals, and the explanation thereof is omitted.

In this example also, a flexible print circuit (FPC) substrate is used as the chip-transcribed second substrate 21, and it is no longer necessary to form a wiring film on the support substrate. In this example, the FPC wiring 26 and the drive circuit 22 are connected via a via plug.

(Twelfth Embodiment)

Figure 18:
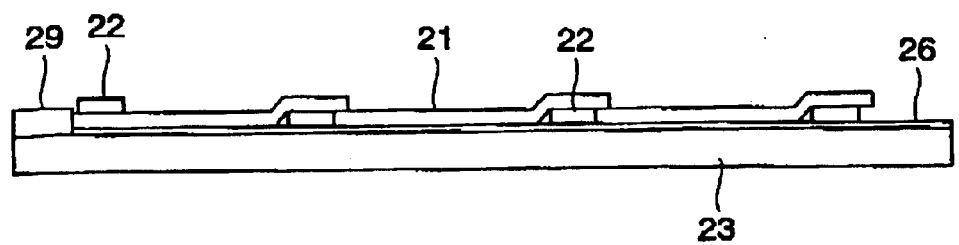
FIG. 18 is an explanatory diagram for explaining the eleventh embodiment according to the present invention.

FIG. 18 shows the twelfth embodiment. In FIG. 18, the components corresponding to those in FIG. 4 are given the same reference numerals, and the explanation thereof is omitted.

In this example, as a result of using a flexible [print] circuit (FPC) or the like, one side of the respective chip-transcribed second substrates 21 disposed in a line-column is partially running upon the drive circuit 22 of the adjoining chip-transcribed second substrate 21. Circuit connections are respectively enabled between the connection terminal and drive circuit 22 at the lower face of the portion where the chip-transcribed second substrate 21 is running upon, between the drive circuit 22 and wiring 26, and between the connection terminal and wiring 26 at the lower face of the chip-transcribed second substrate 21. As described above, an anisotropic conductive film, connection terminal, conductive adhesive agent and the like may be used for the connection. Facilitation of the circuit connection can be sought thereby. Moreover, as the height of the protruding portions of the entire assembled substrate will be approximately the same height, for instance, assembly can be further facilitated upon sealing the liquid crystal or packaging the organic EL.

(Application Examples in Electro-Optic Devices and Electronics Devices)

Figure 19:
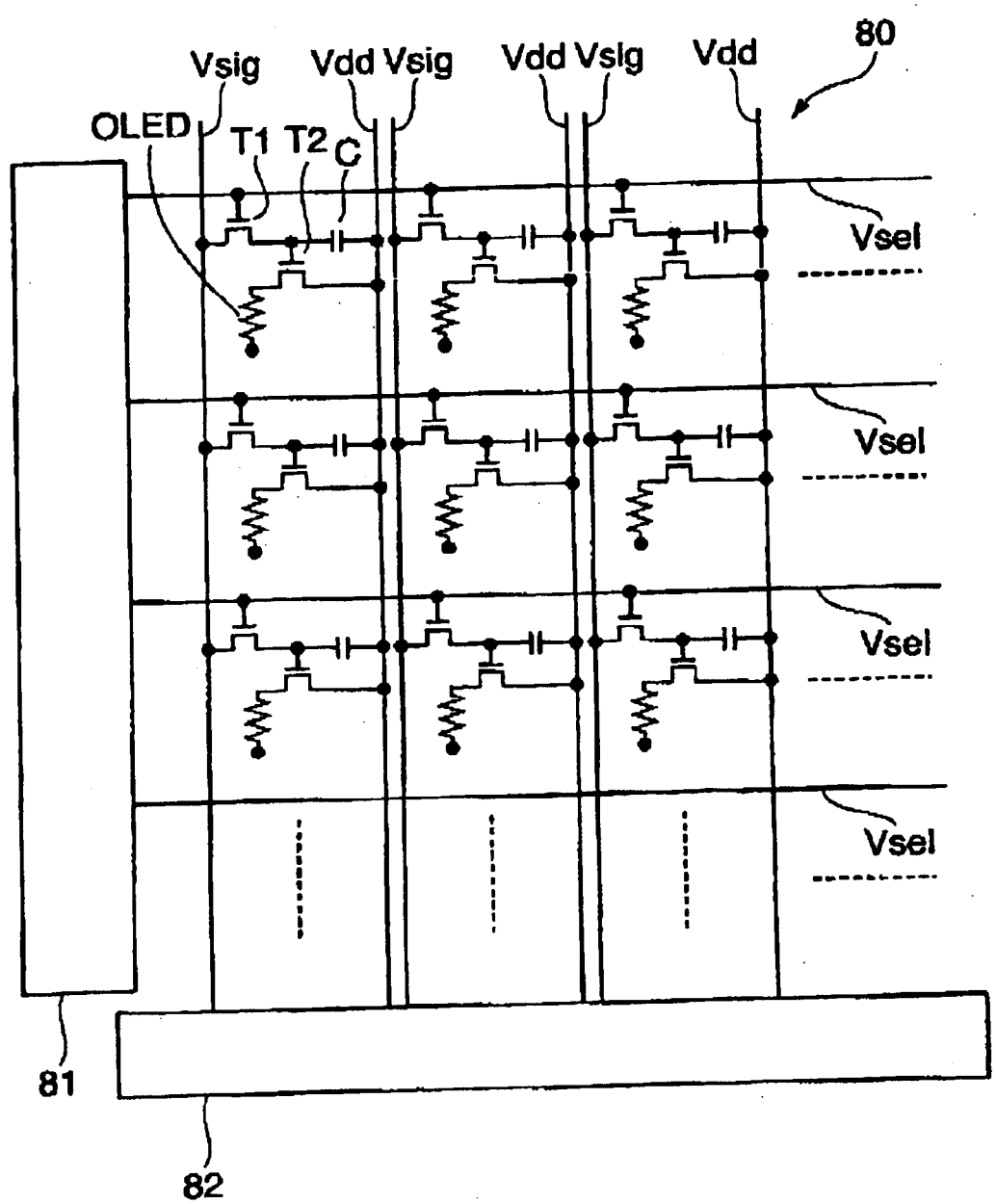
FIG. 19 is an explanatory diagram for explaining the twelfth embodiment according to the present invention.

FIG. 19 shows an example of the circuit connection of the display device having the structure of the invention described above. The display device 80 of the present embodiment comprises a light emitting layer OLED capable of emitting light by the electroluminescence effect at the respective pixel areas, and a retention volume C for storing the current for driving such light emitting layer OLED, and is structured by further comprising the thin film transistors T1 and T2 manufactured with the manufacturing method of the present invention. A selection signal line Vsel is supplied from the driver area 81 to the respective pixel areas. A signal line Vsig and a power source line Vdd are supplied from the driver area 82 to the respective pixel areas. As a result of controlling the selection signal line Vsel and signal line Vsig, the electric current program is performed to the respective pixel areas, and the luminescence of the light emitting portion OLED is controlled thereby. Here, the driver area 81 and driver area 82 correspond to the drive circuit 22 described above.

Moreover, the connection circuit of the display device 80 is an example of a circuit in a case of employing the electroluminescence element as the light emitting element, and may also be structured of other circuits. Further, a liquid crystal display element may also be used as the light emitting element by variously changing the circuit structure.

In addition, the display device 80 of the present embodiment is applicable in various electronics devices. FIG. 20 exemplifies the electronics devices to which the present display device (or display panel) 80 can be applied.

Figure 20A:
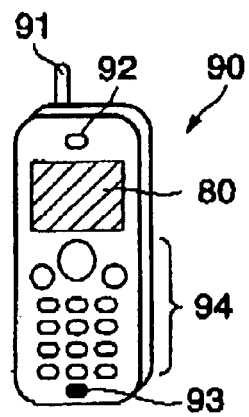
FIG. 20A to FIG. 20F are explanatory diagrams for explaining the systems of the display device employing an organic EL as the electro-optic device to which the present invention as been applied.

FIG. 20A is an application example in a portable telephone, and this portable telephone 90 comprises an antenna unit 91, a sound output unit 92, a sound input unit 93, an operation unit 94, and the display panel 80 of the present invention. In this manner, the display device of the present invention may be used as a display unit.

Figure 20B:
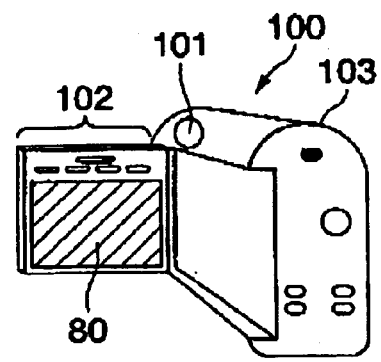

FIG. 20B is an application example in a video camera, and this video camera 100 comprises a picture reception unit 101, an operation unit 102, a sound input unit 103, and the display device 80 of the present invention. In this manner, the display device of the present invention may be used as a finder or a display unit.

Figure 20C:
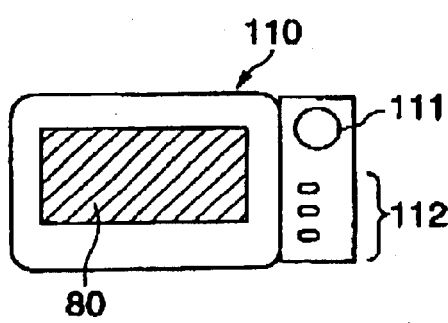

FIG. 20C is an application example in a portable personal computer, and this computer 110 comprises a camera unit 111, an operation unit 112, and the display device 80 of the present invention. In this manner, the display device of the present invention can be used as a display unit.

Figure 20D:
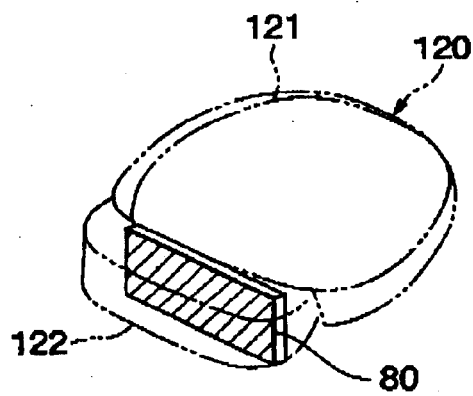

FIG. 20D is an application example in a head mount display, and this head mount display 120 comprises a band 121, an optical system housing unit 122, and the display device 80 of the present invention. In this manner, the display device of the present invention may be used as an image display source.

Figure 20E:
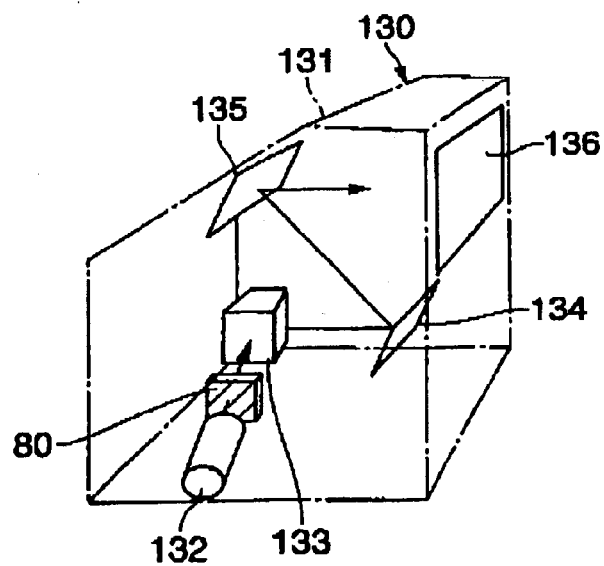

FIG. 20E is an application example in a rear projector, and this projector 130 comprises, in a case 131, a light source 132, a synthetic optical system 133, a mirror 134, a mirror 135, a screen 136, and the display device 80 of the present invention. In this manner, the display device of the present invention may be used as an image display source.

Figure 20F:
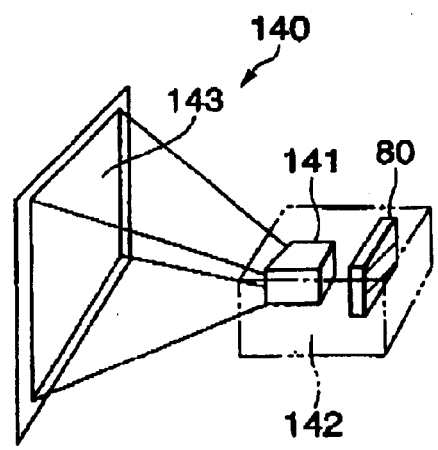

FIG. 20F is an application example in a front projector, and this projector 140 comprises, in a case 142, an optical system 141 and the display device 80 of the present invention, and enables images to be displayed on the screen 143. In this manner, the display device of the present invention may be used as an image display source.

Notwithstanding the foregoing examples, the display device 80 according to the present invention is applicable to any and all electronics devices capable of employing an active matrix display device. For instance, without limitation to the foregoing large screen display device, in addition, the present invention may also be utilized in the likes of a facsimile device with a display function, finder of a digital camera, portable television, DSP device, PDA, electronic notebook, electric bulletin board, and display for publicity and advertisement.

Each of the embodiments described above, in particular, the respective embodiments relating to the arrangement and connection of FIG. 2, and FIG. 4 to FIG. 9, may be worked in proper combinations.

As described above, with the semiconductor device according to the present invention, as it is possible to combine a plurality of formed substrates with the circuit substrate transcription technology, this is preferable in that a large size device can be assembled with a relatively small manufacturing device.

What is claimed is:

1. A manufacturing method of a semiconductor device, comprising:

a transcription substrate formation step of forming on a first substrate a circuit chip containing a thin film element or a thin film circuit via a stripping layer;

a stripping-transcription step of stripping the circuit chip formed on said first substrate and transcribing this directly, or via transcription to a third substrate, to a second substrate; and a second substrate arrangement step of arranging on a base substrate, in a tile shape, a plurality of second substrates to which said circuit chip has been transcribed, such that adjoining second substrates are at least partly in contact with one another.

2. A manufacturing method of a semiconductor device according to claim 1, said second substrate arrangement step further comprising:

a connection step of electrically connecting, among the plurality of second substrates arranged in said tile shape, mutually adjoining substrates by wiring formed on said base substrate.

3. A manufacturing method of a semiconductor device according to clam 1, said second substrate arrangement step further comprising:

a connection step of overlapping at an overlapping portion, among the plurality of second substrates arranged in said tile shape, at least portions of mutually adjoining second substrates, and electrically connecting the mutually adjoining second substrates at said overlapping portion.

4. A manufacturing method of a semiconductor device according to claim 1, said second substrate arrangement step comprising:

a step of disposing said second substrates in said tile shape by preforming portions of said second substrates to be of a complementary shape to two adjoining second substrates, engaging said complementary shape portions with the two adjoining second substrates, and repeating the engagement of said complementary shape portions with said two adjoining second substrates.

5. A manufacturing method of a semiconductor device according to claim 1, said thin film element is a thin film transistor or an organic electroluminescence element.

6. A manufacturing method of a semiconductor device, comprising:

a transcription substrate formation step of forming on a first substrate a circuit chip containing a thin film element or a thin film circuit via a stripping layer;

a stripping-transcription step of stripping the circuit chip formed on said first substrate and transcribing this directly, or via transcription to a third substrate, to a second substrate; and a second substrate arrangement step of arranging in a tile shape a plurality of second substrates to which said circuit chip has been transcribed, such that adjoining second substrates are at least partly in contact with one another, disposing on a boundary of the arranged second substrates a fourth substrate for crossing said boundary, and electrically connecting mutually adjoining second substrates via said fourth substrate.

7. A manufacturing method of a semiconductor device, comprising:

a transcription substrate formation step of forming on a first substrate a circuit chip containing a thin film element or a thin film circuit via a stripping layer;

a stripping-transcription step of stripping the circuit chip formed on said first substrate and transcribing this directly, or via transcription to a third substrate, to a second substrate;

a second substrate arrangement step of arranging on a base substrate, in a tile shape, a plurality of second substrates to which said circuit chip has been transcribed; and a connection step of overlapping at an overlapping portion, among the plurality of second substrates arranged in said tile shape, at least portions of mutually adjoining second substrates, and electrically connecting the mutually adjoining second substrates at said overlapping portion.

8. A manufacturing method of a semiconductor device, comprising:

a transcription substrate formation step of forming on a first substrate a circuit chip containing a thin film element or a thin film circuit via a stripping layer;

a stripping-transcription step of stripping the circuit chip formed on said first substrate and transcribing this directly, or via transcription to a third substrate, to a second substrate; and a second substrate arrangement step of arranging on a base substrate, in a tile shape, a plurality of second substrates to which said circuit chip has been transcribed, and disposing said second substrates in said tile shape by preforming portions of said second substrates to be of a complementary shape to two adjoining second substrates, engaging said complementary shape portions with the two adjoining second substrates, and repeating the engagement of said complementary shape portions with said two adjoining second substrates.

* * * * *